(12) United States Patent
Mallinson

(10) Patent No.: US 7,058,464 B2
(45) Date of Patent: Jun. 6, 2006

(54) DEVICE AND METHOD FOR SIGNAL PROCESSING

(75) Inventor: Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 50 days.

(21) Appl. No.: 10/621,504

(22) Filed: Jul. 17, 2003

(65) Prior Publication Data
US 2005/0012545 A1    Jan. 20, 2005

(51) Int. Cl.
G06F 17/00    (2006.01)
H03F 3/38    (2006.01)

(52) U.S. Cl. .......................................... 700/94; 330/10
(58) Field of Classification Search .................. 700/94; 341/77, 143, 152; 330/10, 251, 107 A; 708/307, 708/305; 332/106, 107; 375/238, 296, 227, 375/228, 346, 350, 241–254
See application file for complete search history.

(56) References Cited

U.S. PATENT DOCUMENTS

| 4,555,795 | A | * | 11/1985 | Bedini ........................ 381/17 |
| 5,559,467 | A | | 9/1996 | Smedley |
| 5,777,512 | A | | 7/1998 | Tripathi et al. |
| 5,903,871 | A | * | 5/1999 | Terui et al. ................. 704/500 |
| 5,974,089 | A | | 10/1999 | Tripathi et al. |
| 6,137,349 | A | * | 10/2000 | Menkhoff et al. .......... 327/552 |
| 6,208,279 | B1 | * | 3/2001 | Oprescu ..................... 341/143 |
| 6,344,811 | B1 | | 2/2002 | Melanson |
| 6,414,560 | B1 | | 7/2002 | Delano |
| 6,466,087 | B1 | * | 10/2002 | Ruha ........................... 330/10 |
| 6,504,427 | B1 | * | 1/2003 | Midya et al. ................. 330/10 |
| 6,515,604 | B1 | | 2/2003 | Delano |
| 6,573,850 | B1 | * | 6/2003 | Pennock ..................... 341/150 |
| 6,593,807 | B1 | * | 7/2003 | Groves et al. ................ 330/10 |
| 6,594,309 | B1 | * | 7/2003 | Botti et al. .................. 375/238 |
| 6,735,398 | B1 | * | 5/2004 | Izadpanah et al. .......... 398/189 |
| 6,794,930 | B1 | | 9/2004 | Nurminen |
| 6,795,004 | B1 | | 9/2004 | Masuda et al. |
| 2004/0037432 | A1 | * | 2/2004 | Lis et al. ................... 381/71.11 |
| 2004/0165661 | A1 | | 8/2004 | Braun |
| 2004/0213333 | A1 | * | 10/2004 | Huang et al. ............... 375/150 |

OTHER PUBLICATIONS dspGuru.com Infinite Impulse Response Filter FAQ.*

(Continued)

*Primary Examiner*—Sinh Tran
*Assistant Examiner*—Andrew C. Flanders
(74) *Attorney, Agent, or Firm*—Ernest J. Beffel, Jr.; Haynes Beffel & Wolfeld LLP

(57) ABSTRACT

The present invention relates to a signal processor and methods of using a signal processor. In one aspect, the present invention relates to a signal processor that includes a pulse width modulator having a clock rate, and also includes a digital filter configured to receive an output of the pulse width modulator, wherein the digital filter samples the output at the clock rate to suppress the distortion. In another aspect, the present invention relates to a method including modulating a first pulse code modulated signal having a first resolution into a second pulse code modulated signal having a second resolution that is smaller than the first resolution. This aspect further includes modulating the second pulse code modulated signal into a third signal that includes a plurality of pulses in time having a clock rate, and filtering in a digital domain the plurality of pulses in time to suppress a distortion in the third signal.

79 Claims, 14 Drawing Sheets

OTHER PUBLICATIONS wikipedia.com definition of Synchronous Circuit.*

"Simple IIR Filters", Eric Hagemann, 2001.

"A 13-Bit, 1.4-MS/s Sigma-Delta Modulator for RF Baseband Channel Applications", A. Feldman, et al., IEEE Journal of Solid State Circuits, vol. 33, No. 10, Oct. 1998.

"A 113dB SNR Oversampling Sigma-Delta DAC for CD/DVD Application", K. Nguyen et al., Analog Devices.

"A Wideband Low-Distortion Delta-Sigma ADC Technology", J. Silva et al.

"A 250 W Audio Amplifier with Straightforward Digital Input—PWM Output Conversion", A. Grosso et al.

Philips Semiconductors, Class D Amplifier Solutions, Oct. 2001.

"The Class-D Amplifier", W. Marshall Leach, Jr., Introduction to Electoacoustics and Audio Amplifier Design, Second Edition, 2001.

"TMS320C67-Based Design of a Digital Audio Power Amplifier Introducing Novel Feedback Strategy", E. Bresch and W. Padgett, Rose-Hulman Institute of Technology, Electrical, and Computer Engineering Department.

"Digital Control Circuit for Class-D Audio Power Amplifier", K. P. Sozanski, et al., Technical University of Zielona Gora, Institute of Electrical Engineering.

Jorge Varona, "Power Digital-to-Analog Conversion Using Sigma-Delta and Pulse Width Modulations," ECE1371 Analog Electronics II, ECE University of Toronto, pp. 1-14, 2001.

Erik Bresch and Wayne T. Padgett, "TMS320C67-Based Design of a Digital Audio Power Amplifier Introducing Novel Feedback Strategy," Rose-Hulman Institute of Technology, Electrical and Computer Engineering Department, pp. 1-16, 1999.

K. P. Sozanski, R. Strzelecki and Z. Fedyczak, "Digital Control Circuit for Class-D Audio Power Amplifier," Power Electronics Specialists Conference, PESC 2001 IEEE 32nd Annual, vol. 2, pp. 1245-1250, 2001.

Morten Johansen and Karsten Nielsen, "A Review and Comparison of Digital PWM Methods for Digital Pulse Modulation Amplifier (PMA) Systems," 107th Convention of Audio Engineering Society, Sep. 24-27, 1999, New York, New York.

Thomas Taul, Karsten Nielsen and Michael A.E. Andersen, "Comparing Nonlinear with Linear Control Methods for Error Correction in Switching Audio Amplifier Output Stages," 104th Convention of Audio Engineering Society, May 16-19, 1998, Amsterdam.

Kartsten Nielsen, "MECC—A Novel Control Method for High End Switching Audio Power Amplification," 105th Convention of Audio Engineering Society, Sep. 26-29, 1998, San Francisco, California.

Crilles Bak Rasmussen, "Hybrid Digital-Analog Feedback Audio Amplifiers," 2004 Dissertation, in cooperation with Bang & Olufsen ICEpower A/A, Lyngby 2004, Eksamensprojekt, NR. IMM-Thesis-2004-68. (Not Prior Art).

M. O. J. Hawksford, "Time-Quantized Frequency Modulation, Time-Domain Dither, Dispersive Codes, and Parametically Controlled Noise Shaping in SDM," J. Audio Eng. Soc., vol. 52, No. 6, pp. 587-617, Jun. 2004. (Not Prior Art).

D. Weiler, P.A. Nielsen, D. Hammerschmidt, O. Machul and B. J. Hosticka, "Single Bit Sigma-Delta Modulator with Nonlinear Quantization for µ-Law Coding," 23rd European Sold-State Circuits Conference, Southhampton, United Kingdom, Sep. 16-18, 1997.

* cited by examiner

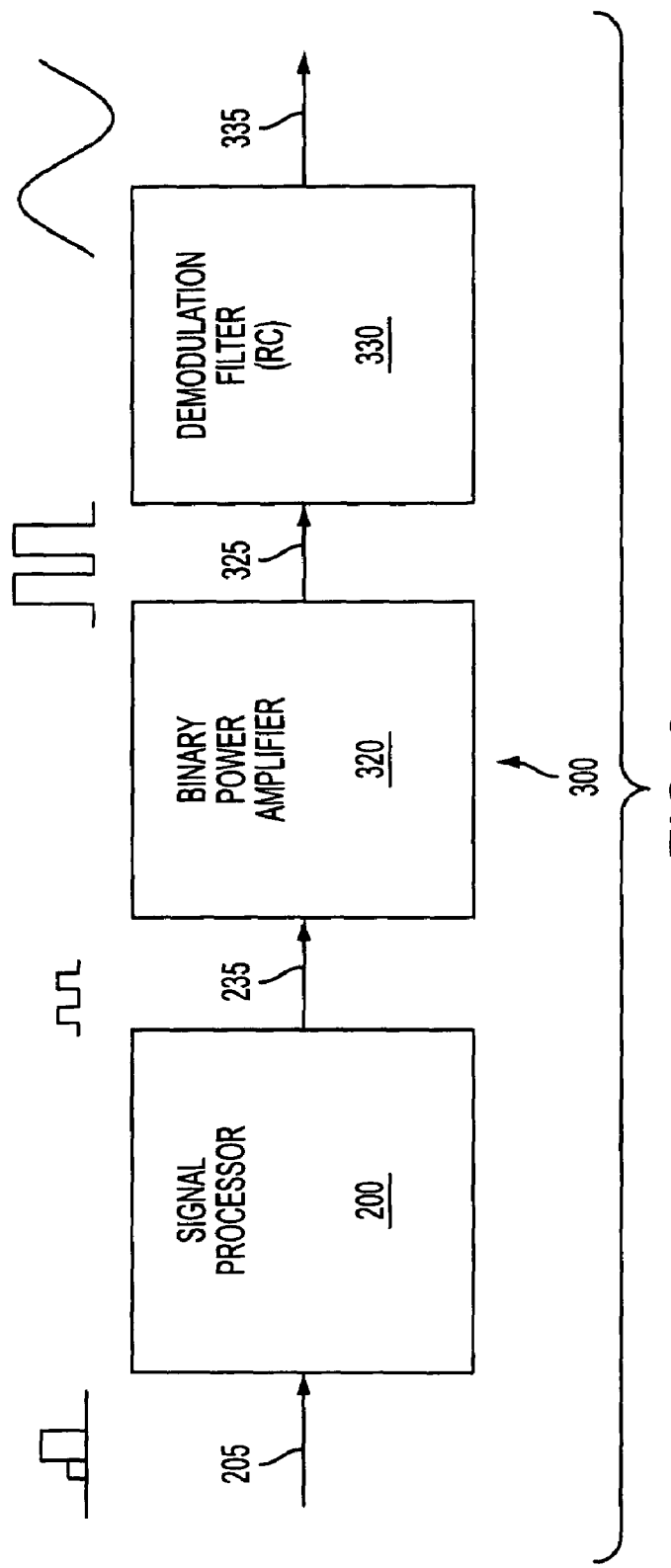

```
module Example_Embodiment  (clk, clken, reset, phase, in, pwm) ;
  parameter WIDTH    = 24 ;              // Data path width
  parameter FACTOR   = 8 ;               // log2 of the divider in the ftr
  parameter PWMW     = 4 ;               // The number bits in the PWM
  parameter MI       = WIDTH - 1 ;       // Max index of bus
  parameter RST_TO   = (1 << MI);        // Reset state...
  input              clk ;               // Main clock
  input              clken ;             // A clock enable qualifier: Fclk is
                                         //   this enable expected to be about
                                         //   (16*32*Fs) = 24Mhz approx.
  input              reset;              // Initialize asynchronous
  input  [PWMW : 0]  phase;              // PWM Phase control
  input  [MI : 0]    in;                 // The input audio data
  wire   [MI : 0]    sin;                // The input scaled to -1.16db (7/8)
  output             pwm;                // The output pwm bit
  reg                pwm;
  wire               pwma;               // Internal asynchronous pwmbit
  wire   [MI : 0]    fb;                 // Feedback quantity..
  wire   [WIDTH : 0] err;                // Error signal from differencer
  wire   [MI : 0]    serr;               // Scaled error value
  reg    [MI : 0]    int;                // Integrator in FB loop...
  wire   [WIDTH : 0] sum;                // The actual sum prior to clip
  wire   [MI : 0]    nxt_int;            // Next state of clipped integrator
  wire   [MI : 0]    nxt_int1;           // Intermediate next state
  wire               force_all_one;      // Overflow and underflow bits
  wire               force_all_zero_b;
  // The forward path through the PWM to the output stream:
  pwm # (WIDTH, PWMW) pwmi (clk, clken, reset, phase, int, pwma) ;
  // The feedback path through the filter:
  ftr # (WIDTH, FACTOR) ftri (clk, clken, reset, pwma, fb) ;
  // This is one example way to clip an integrator - namely, process one
  // extra bit and look for a difference in the extra bit and the
  // sign bit like this.
  assign #3 sum              = { serr[MI] , serr }
                             + { int[MI], int };
  assign #0 force_all_one    = sum[MI] & ~sum[MI+1] ;   // Hi => OVF
  assign #0 force_all_zero_b = (sum[MI] | ~sum[MI+1]) ; // Lo => UFL
  // This next line forces the nxt_dout1 bus to all 1 if force_all_one
  // is true, forces it all 0 if force_all_zero_b is false...
  assign #0 nxt_int1 = ( { ~sum[MI], sum[MI-1 : 0] }
                       | { WIDTH { force_all_one } } )
                       & { WIDTH { force_all_zero_b } } ;
  // .. and then just make the signed version..
  assign #0 nxt_int = { ~nxt_int1 [MI] , nxt_int1 [MI-1 : 0] } ;
  // Create the reduced amplitude input; in some cases, it may be advantageous
  // to drop the signal so that peaking at 15k is not distorted..
  assign #0 sin = in - { { 3 { in[MI] } }, in [MI : 3] };  // ie in - 1/8 in
  // Now create the integrator in the loop .. first assign the
  // error gain: in this case, about 3/32
  assign #1 err  = sin - fb;
  assign #1 serr = ( { 4 { err[MI] } }, err[MI : 4] }        // ie 1/16
                 + ( { 5 { err[MI] } }, err[MI:5] } ;         // + 1/32
  always @ (posedge clk or posedge reset)
    if (reset)
      begin
        int <= RST_TO;
        pwm <= 1'b0;
      end
    else if (clken)
      begin
        int <= nxt_int;
        pwm <= pwma;
      end
endmodule // Example_Embodiment
```

FIG. 7A

```
// ========================= PWM CELL =========================
// This is an example cell that accepts a parallel input bus and creates the
// output PWM stream...
module pwm (clk, clken, reset, phase, in, out) ;
    parameter WIDTH    = 16;              // Data path width
    parameter PWMW     = 4;               // The number bits in the PWM
    parameter MI       = WIDTH - 1;       // Max index of bus
    parameter PI       = PWMW - 1;        // Max index of phase bus
    parameter PMAX     = ( (1 << PWMW) - 1) ; // Max phase count
    input              clk;               // Main clock
    input              clken;             // A clock enable qualifier: Fclk is
                                          // this enable
    input              reset;             // Initialize asynchronous
    input [MI:0]       in;                // The input state
    output             out;               // The output state
    input [PWMW:0]     phase;             // This is used to allow the clk to
                                          // run faster than the BRM so that
                                          // the multi levels are converted
                                          // to pulse widths. The MSB
                                          // controls the odd/even phase, the
                                          // other bits the PWM
    wire [PI:0]        pwm;               // Pulse width required..
    wire               pwmi;              // .. increment by one of above
    wire [PI:0]        sum;               // Temporary - used in PWM..
    wire               pmax;              // Phase MSB is about to change
    wire               pdoe;              // Enable to the pdo
    // Asynchronously find when the phase MSB is about to change:
    assign             pmax = (phase[PI:0] == PMAX) ? 1 : 0;
    // Enable the pdo only when the phase MSB is about to change and
    // when the input is enabled - this generates the pdo clken signal:
    assign             pdoe = pmax & clken;
    // Modulate the input bus into the PWM Width using something
    // very similar to the pdo cell again, but note that this generates
    // an output bus of width PWM width (and note this only runs at a
    // fraction of the input clock rate)..
    pdow # (PWMW, WIDTH) pdop (clk, pdoe, reset, in, pwm, pwmi) ;
    // Now generate the pulse output by comparing the phase
    // count to the multi-bit output, however this comparison depends
    // upon the phase MSB.. Lisp code for reference:
    // (if (<= (if MSB (1+ phase) (- dith phase)) pwm) 1 -1)
    // A simple equivalent can be found by looking at the carry
    // output of the following expression:
    assign {out,sum} = ( { { PWMW { phase [PWMW] } } } ^ phase[PI:0])
                       + pwm + pwmi;
    // Thus the output variable (out) is asynchronous - it occurs
    // shortly after the clock.
endmodule // pwm
```

FIG. 7B

```
// ======================= FILTER CELL =========================
// This is an example filter cell for the Example_Embodiment application,
// which includes a single bit in the feedback input. It's a
// simple IIR single pole filter like this: y <= y + a(x-y) where a is
// 1/(2^FACTOR)
module ftr (clk, clken, reset, in, out);
    parameter WIDTH    = 16;            // Data path width
    parameter FACTOR   = 9;             // The log2 of the divider
    parameter MI       = WIDTH - 1;     // Max index of bus
    input              clk;             // Main clock
    input              clken;           // A clock enable qualifier: Fclk is
                                        //  this enable
    input              reset;           // Initialize asynchronous
    input              in;              // The input state
    output [MI:0]      out;             // The output state
    reg    [MI:0]      out;
    always @ (posedge clk or posedge reset)
        if (reset)
            begin
                out <= 0 ;
            end
        else if (clken)
            begin
                out <= out
                    - { { FACTOR { out [MI] } } , out [MI:FACTOR] }
                    + { { FACTOR+1 { ~in } } , { MI-FACTOR { in } } } ;
            end
endmodule // ftr
```

FIG. 7C

```
// ========================= PDOW CELL =============================
// This cell is essentially a first order ΣΔ modulator - it creates
// an output word (out) and a bit (inc) indicating the word should be
// incremented by one to minimize the noise. There is one other
// circumstance to attend to here - the 'in' may be clocked at
// a rate that differs from this clock so that the following registers the input on
// the enabled clock of this cell..
module pdow (clk, clken, reset, in, out, inc);
    parameter M  = 4;              // The number of bits that are
                                   // "dithered"
    parameter N  = 16;             // The width of the input number
    parameter NI = N - 1;          // Max index needed in width N
    parameter MI = M - 1;          // Max index needed in width M
    parameter ME = NI - M;         // max index of the residue: this is
                                   // the max index of the quantity
                                   // that is accumulated in the
                                   // modulo N error accumulator
    parameter RS = N - M;          // The amount to right shift the din
                                   // bus
    input       clk;               // Main clock
    input       clken;             // A clock enable qualifier: Fclk is
                                   // this enable
    input       reset;             // Initialize asynchronous
    input [NI:0] in;               // The input state
    reg   [NI:0] rin;              // Registered input state
    output [MI:0] out;             // The output state
    output       inc;              // The SD bit itself
    reg   [ME:0] state;            // The local state of the modulo n error
    wire  [ME:0] state_nxt;        // next state of the modulo n error
// Just add the LSBs of the input to the running total in state,
// allow state to overflow and keep track of the overflow bit in
// the inc wire:
assign {inc, state_nxt} = {1'b0, state} + {1'b0, rin[ME:0] };
// The output is just the msbs that are not being accumulated in
// the state, plus 1 if the state has overflowed - as indicated in
// the inc bit...
assign  out = { ~rin[NI] , rin[NI-1:RS] };
// clock like this:
always @ (posedge clk or posedge reset)
  if (reset)
    begin
      state <= 0;
      rin   <= 0;
    end
  else if (clken)
    begin
      rin   <= in;
      state <= state_nxt;
    end
endmodule // pdow
```

FIG. 7D

DEVICE AND METHOD FOR SIGNAL PROCESSING

FIELD OF THE INVENTION

The present invention relates to signal processing technology and, more particularly, to devices and methods for processing digital signals such as, for example, digital audio signals.

BACKGROUND OF THE INVENTION

It has been documented that a digital-to-analog converter may be used to process digitized signals for amplification by an analog power amplifier. For example, Erik Bresch and Wayne T. Padgett in "TMS320C67-Based Design Of A Digital Audio Power Amplifier Introducing Novel Feedback Strategy" (http://www.ti.com/sc/docs/general/dsp/fest99/poster/hbreschpadgett.pdf) describe such an amplification technique used in connection with audio signals. FIG. 1 shows a basic structure of a Class-D type audio power amplifier as depicted by Bresch and Padgett.

Certain digital audio signal sources, such as compact disk (CD) players, provide digitized audio signals that are pulse code modulated. Such digitized audio signals may have a 16-bit resolution and a 44.1 kHz sampling frequency. However, the audio signal may need to be modulated and amplified to be useful in particular applications.

A number of techniques allow a digital data stream to be represented as an analog signal. One such technique includes the use of a sigma-delta modulator, and another technique includes employing a pulse width modulator.

Each of these two techniques has certain advantages and disadvantages for particular applications. For example, output from a sigma-delta modulator may have a high degree of accuracy such that the amount of noise is relatively low and the amount of total harmonic distortion (THD) is favorable (perhaps about 0.001%) for certain audio equipment applications. As documented by James Candy and Gabor Temes in "OverSampling Delta-Sigma Data Converters" (ISBN 0-87942-285-8), one conventional technique used in certain sigma-delta modulators is to convert a stream of 16-bit audio data into a stream of 4-bit data at a higher clock rate. It has also been documented that the noise associated with such a quantization to 4-bits may be "shaped" so that it all appears in relatively high frequencies. However, one disadvantage of such a technique (at least for certain audio equipment applications) is that digital output from a sigma-delta modulator may not be easily converted into an analog voltage due to variable frequencies present in the data stream.

A pulse width modulator may produce an output with a low and controlled frequency that may be able to drive a Class-D type audio power amplifier and be relatively easily converted into an analog voltage. In addition, certain pulse width modulation techniques may introduce less error than certain sigma-delta modulation techniques.

Certain developers have tried to produce a signal with the positive distortion and noise performance characteristics of a sigma-delta modulation technique, as well as the low frequency and predicable output characteristics of a pulse-width-modulation technique. For example, Bresch and Padgett have documented one such attempt in "TMS320C67-Based Design of a Digital Audio Power Amplifier Introducing Novel Feedback Strategy." In addition, it has been documented by K. P. Sozaski, R. Strzelecki and Z. Fedyczak in "Digital Control Circuit for Class-D Audio Power Amplifier" that an attempt to combine a sigma-delta type modulator with a pulse width modulator resulted in a signal-to-noise ratio that approached 75 db in the audio frequency band (i.e., 20 Hz to 20 kHz). However, such performance may be insufficient or unacceptable in certain circumstances or for particular users.

Recognizing that a pulse width modulator may introduce distortion (which is thought to be caused by a high harmonics content in the audio frequency band) into a signal such as an audio signal, certain developers have tried to reduce the distortion by (1) using a sigma-delta-to-pulse-width-modulator circuit to create an analog output, and then (2) feeding back that analog output in a closed loop system to create an error signal. U.S. Pat. No. 6,515,604 to Delano discusses such a system to create an error signal. Bresch and Padgett discuss another system of this type in "TMS320C67-Based Design of a Digital Audio Power Amplifier Introducing Novel Feedback Strategy."

For certain applications or users, however, it may be desirable to correct for distortion in the digital domain. In addition, it may be desirable at least for particular audio equipment applications to have a signal processor capable of a high degree of noise shaping similar to a sigma-delta modulator. Additional favorable characteristics of such a signal processor may include both a modulation depth such that large signal amplitudes may be generated in a particular frequency range (e.g., the audio frequency range), as well as the use of a relatively small and fixed number of values for a given time period such that a simple digital to analog converter can be made using, for example, an RC network connected to a simple digital driver. Yet another desirable characteristic of such a signal processor may be a low output frequency so that it can be used to drive switches (e.g., MOSFETs) of the type used in certain Class-D type audio power amplifiers.

SUMMARY OF THE INVENTION

In one aspect, the invention features a signal processor with a pulse width modulator that has a clock rate. The signal processor of this aspect also includes a digital filter configured to receive an output of the pulse width modulator, wherein the output includes distortion and wherein the digital filter samples the output at the clock rate to suppress the distortion.

In another aspect, the invention features a digital circuit for suppressing distortion in a digital signal that exists after a pulse width modulation, wherein the pulse width modulation occurs at a clock rate, and wherein the digital circuit includes a digital filter configured to receive the signal having the distortion and to sample the signal at the clock rate.

In a further aspect, the invention features a digital signal processing circuit including a pulse width modulator having an output with a distortion, the circuit further including means for sampling the output and suppressing the distortion in a digital domain.

In yet another aspect, the invention features a signal processor for modulating a digital input signal. The processor of this aspect includes a closed loop digital circuit having a forward path with a filter coupled with and upstream from an encoder stage, wherein the encoder stage has a first order sigma-delta type modulator and a pulse width modulator. In such an aspect, the sigma-delta type modulator generates an oversampled signal that has a period and a total number of levels, and the pulse width modulator operates at a clock rate that is M times the period, where M is the total number of levels in the oversampled signal, and wherein the forward path produces an output and a distortion. Also, in such an aspect, the processor further includes a feedback path that has a low pass single pole IIR filter that samples the output in a digital domain to suppress the distortion.

In another aspect, the invention features a signal processor that includes an oversampling circuit coupled with a pulse width modulation circuit that has an output. In this aspect, the signal processor also includes a feedback path with a digital filter that samples the output in a digital domain.

In a further aspect, the invention features an integrated circuit chip configured to receive a pulse code modulated digital signal and to generate a pulse width modulated digital signal having a distortion, wherein the distortion is suppressed by a digital filter that operates at a clock rate of the pulse width modulated digital signal.

In still another aspect, the invention features a method including modulating a first pulse code modulated signal having a first resolution into a second pulse code modulated signal having a second resolution, wherein the second resolution is smaller than the first resolution. In such an aspect, the method also includes modulating the second pulse code modulated signal into a third signal that has a plurality of pulses in time generated at a clock rate, and further includes filtering in a digital domain the plurality of pulses in time to suppress a distortion in the third signal.

In a further aspect, the invention features a device that includes means for modulating a first pulse code modulated signal having a first resolution into a second pulse code modulated signal having a second resolution, wherein the second resolution is smaller than said first resolution. In such an aspect, the device further includes means for modulating the second pulse code modulated signal into a third signal having a plurality of pulses in time having a clock rate, as well as means for filtering in a digital domain the plurality of pulses in time to suppress a distortion in the third signal.

BRIEF DESCRIPTION OF THE DRAWINGS

The foregoing features and other aspects of the invention are explained in the following description taken in connection with the accompanying drawings, wherein:

FIG. 3 depicts a block diagram of a digital power amplification system 300 according to an embodiment of the present invention;

FIGS. 7a–7d depict a computer code listing of Verilog modules representing one embodiment of the present invention.

Figure 1:
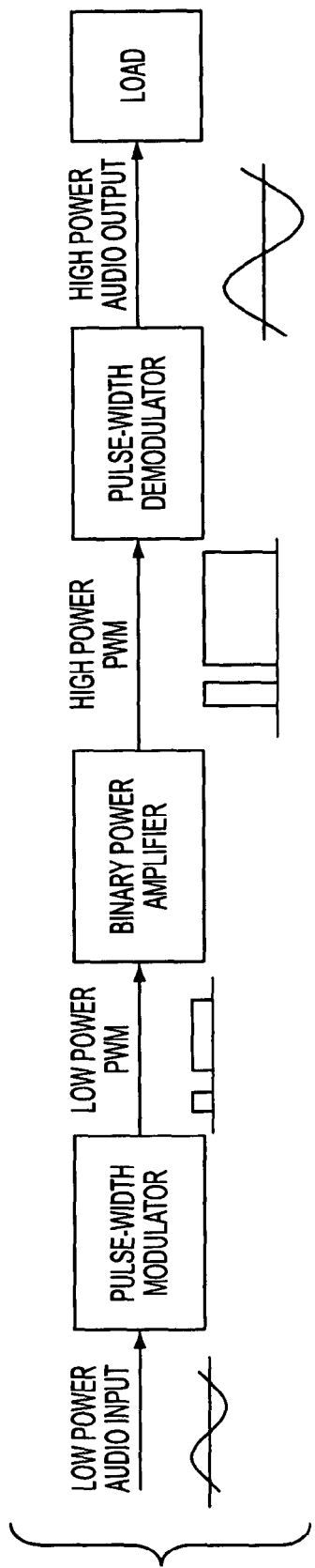
FIG. 1 depicts a block diagram of a conventional structure of a Class-D audio amplifier, as documented by Bresch and Padgett.

It is to be understood that the drawings are exemplary, and are not to be deemed limiting to the full scope of the appended claims.

DETAILED DESCRIPTION OF PREFERRED EMBODIMENTS

Various embodiments of devices, systems and methods in accordance with embodiments of the present invention will now be described with reference to the drawings.

In one embodiment of the present invention, a signal processor 200 receives a digital wide-bit input signal and uses feedback that is entirely in the digital domain to correct for any error that may be introduced into the output signal 235 by the process of pulse width modulating the input signal 205. Various embodiments of the present invention may include, for example, (1) an integrated circuit chip 501 for use in an optical disk player (e.g., a digital versatile disk (DVD) player), wherein the chip 501 contains at least two signal processors 200-1, 200-2 (i.e., one for left channel output and the other for right channel output), (2) an integrated circuit chip 551 for use in a surround sound audio power amplifier, wherein the chip 551 may contain eight signal processors 200-1 to 200-8 (i.e., one for each of eight output channels), (3) a portable electronics player 600, which may have headphones, wherein at least one signal processor 200 is used in connection with a digital power amplification system 300 such as, e.g., a headphone amplifier; (4) a general purpose digital-to-analog converter such as may be used in an industrial automation system (e.g., a 16-bit digital-to-analog converter), and (5) an integrated circuit chip for use in telecommunications equipment (e.g., a mobile or cellular phone).

Figure 2:
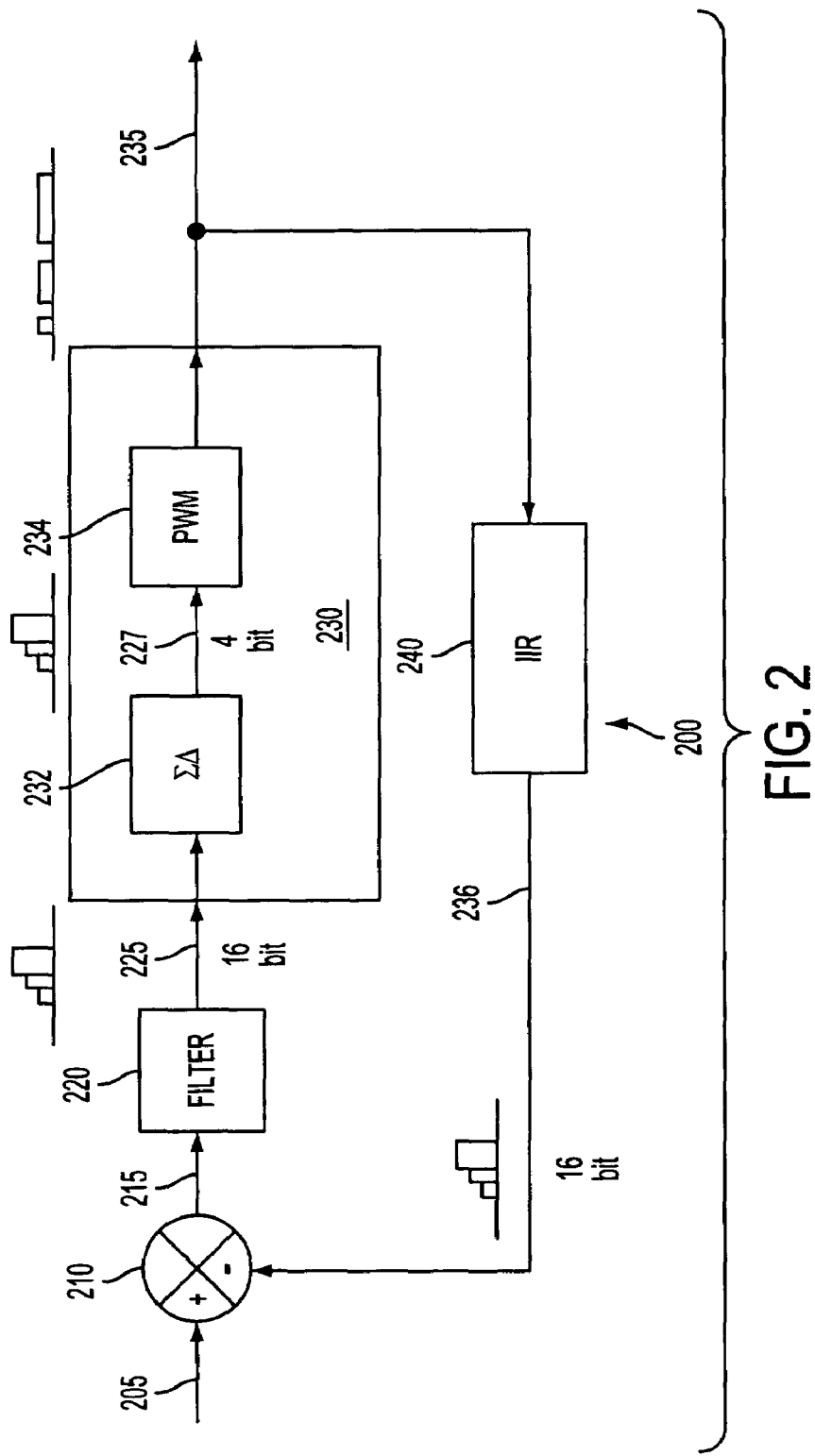
FIG. 2 depicts a block diagram of an embodiment of a signal processor 200 according to the present invention.

As depicted in FIG. 2, one embodiment of the present invention features a closed loop signal processor 200 which implements a digital filter 240 that samples a pulse width modulated output signal 235 entirely in the digital domain to thereby assess and correct for distortion. In particular, FIG. 2 depicts a block diagram of a closed loop signal processor 200 according to one embodiment of the invention. In this embodiment, a digital input signal 205 is sent through a forward path that includes an integrator stage 220 and an encoder stage 230, and is augmented by a fully digital feedback path that closes the control circuit of the embodiment. The digital input signal 205 may be, for example, a 16-bit pulse code modulated signal at a 44.1 kHz frequency. A digital filter 240 of the embodiment shown in FIG. 2 may help capture distortion created by the encoder stage 230 (and, more specifically, distortion created by the conversion technique of an embodiment that has an oversampling filter 232 to pulse width modulator 234 combination) because the digital filter 240 of the embodiment samples each of the sub-intervals of the pulse width modulated signal 235 and uses a low pass filter to smooth the pulse width modulated digital signal 235 datastream.

The filter stage 220 of one embodiment may be a single digital integrator (i.e., a single pole filter with a origin pole). In such an embodiment, the filter stage 220 receives and accumulates any difference there may be between the digital input signal 205 and a filtered signal 236. Eventually, such filter stage 220 helps correct the difference to exactly or approximately zero (i.e., corrects the error to zero). Thus, in one embodiment, the transfer function of the filter stage may be an integrator $-H(s)=1/s$. A filter output signal 225 is sent to the encoder stage 230. In another embodiment, the filter stage 220 may be a second order element.

The encoder stage 230 of one embodiment may modulate the filter output signal 225 (which in this embodiment may be in the form of a pulse code modulated signal) into a pulse width modulated signal 235. The encoder stage 230 of the embodiment depicted in FIG. 2 includes an oversampling filter 232 and a pulse width modulator 234. The oversampling filter 232 of such an embodiment may be, for example, a first order sigma-delta type modulator. In one example embodiment, the oversampling filter 232 may modulate the 16-bit filter output signal 225 at 44.1 kHz into a 4-bit oversampled signal 227 at 1.411 MHz (i.e., 32* 44.1 kHz, which is also called "32×" oversampling). In other embodiments, the oversampling filter 232 may modulate a wide-bit signal (e.g., 12–24 bits) into a signal of only a few bits (e.g., 2–6 bits). The oversampling filter 232 of such an embodiment may be implemented, for example, in a complementary metal oxide semiconductor (CMOS) process.

A sigma-delta modulator 232 of one embodiment may be able to express an amplitude at each sample over a small number of bits, while a pulse width modulator 234 may be able to express an amplitude at each cycle over a short amount of time. The sigma-delta modulator 232 may be very accurately representing the signal with a certain noise characteristic by generating the 4 bits at precise times. However, an unaugmented output signal generated by a pulse width modulator that uses an intermediate sigma-delta modulator to generate the pulse widths in each period may be unsatisfactory or undesirable in certain instances because the output signal may contain a significant amount of distortion. Such distortion is thought to be caused, at least in part, by the inability of a pulse width modulator to render a sample from the sigma-delta modulator at a precise time.

Mathematically, it is necessary for the bits output from the sigma-delta modulator 232 of one embodiment to be considered as being a good sample at the exact time of the clock that created them. However, although a pulse width modulator 234 may be accurate, it may not be able to maintain this precise timing. For example, if the output of the pulse width modulator 234 is high for the first quarter of the period, a signal level of ¼ is represented. If the output of the pulse width modulator 234 is high for the last quarter of the period though, the signal level is also represented as ¼. Although both of these pulse modulator 234 states represent the same signal level (i.e., ¼ of the signal value), they do so at different times. This inability of the pulse width modulator 234 of one embodiment to render the sigma-delta sample at a precise time is thought to be, at least in part, the cause of distortion introduced by certain sigma-delta-to-pulse-width-modulator encoding processes.

The pulse width modulator 234 of the embodiment shown in FIG. 2 converts the oversampled signal 227 (e.g., a 4-bit signal) from a pulse code modulated digital signal into a relatively small range of time values, such as a pulse width modulated digital signal 235. For example, if the stream of 4-bit data were to be used to control the pulse width modulator 234 such that a 4-bit sample represents the value "5," then the output of the pulse width modulator 234 would be in a high state for 5/16 of its period (in general, if 4-bit data is used to encode a value "N," then the output of the pulse width modulator 234 would be a high state for N/16 of its period). In such an embodiment, the pulse width modulator 234 may operate at a clock rate that is 16 times the period of the oversampled signal 227. This clock rate for the pulse width modulator 234 is M times the rate of the oversampling filter 232 (where M=16, and is the number of levels in the oversampled signal 227). In at least one embodiment, such a clock rate enables a proper variable pulse width output signal to be created.

The signal processing circuit 200 depicted in FIG. 2 also includes a feedback path. As shown in FIG. 2, the pulse width modulated signal 235 is fed into a digital filter 240 before being combined with (and in this case, subtracted from) the digital input signal 205 at a summing point 210. In this way, the error signal that is fed to the filter stage 220 is the difference between the digital input signal 205 and a filtered signal 236. The digital filter 240 of the embodiment shown in FIG. 2 operates at the clock rate of the pulse width modulator 234, and therefore is able to sample the pulse width modulated output signal 235 at the same rate as the possible quantizations in time of that output.

For example, if the pulse width modulator 234 of one embodiment is running at a clock rate of 16 MHz, it may be able to process a 4-bit quantity over 16 clock cycles. To do so, this pulse width modulator 234 will expect to be provided with a 4-bit quantity at a clock rate of 1 MHz, and then over the next 16 clock cycles (i.e., over the next microsecond before the pulse width modulator 234 processes the next sample), the pulse width modulator 234 generates a pulse width modulated digital signal 235. If the digital filter 240 is operating at the same rate as the pulse width modulated quantizations in time are being received (in this example, a rate of 16 MHz), the digital filter 240 is able to sample every piece of mathematical information present in the pulse width modulated output signal 235. In particular, the digital filter 240 will receive a sample of every one of the possible positions in time of the pulse width modulated output signal 235, thereby allowing the digital filter 240 to measure the pulse width modulated output signal 235 with no error. Although the digital filter 240 of such an embodiment is not able to appreciate anything happening faster than its clock rate, no information is lost because the pulse width modulator 234 is also not able to change faster than this same clock rate. In this way, the digital filter 240 of one embodiment is able to capture every one of the bits of the pulse width modulated output signal 235.

The digital filter 240 of one embodiment is also able to resynthesize the output signal 235 into a wide-bit (e.g., 16-bit) representation of the output signal 235 to create a filtered signal 236, which is a pulse code modulated signal of the same bit width and clock rate as the digital input signal 205. This filtered signal 236 can then be subtracted from the digital input signal 205 to form an error signal. In one embodiment, the digital filter 240 uses a digital filter design to resynthesize the output signal 235 to form a wide-bit filtered signal 236. This digital filter 240 may be an integrator or recursive averager such as, for example, a simple IIR single pole filter (e.g., $y(n)=y(n-1)+a(x(n)-y(n-1))$, where "a" is a scaling factor such as $1/(2^9)$).

Although the embodiment shown in FIG. 2 includes a closed loop feedback path, it is to be understood that equivalent embodiments using, for example, a feed-forward path or other open loop circuit, may also be implemented.

The closed loop response of the embodiment shown in FIG. 2 is such that distortion from the encoder stage 230 is suppressed, and a number of favorable performance characteristics may be realized. For example, an embodiment of the present invention may exhibit a modulation depth of up to −1 db in the audio frequency band.

In addition, an embodiment of the present invention may suppress errors in the pulse width modulation process such that THD is reduced to about 90–100 db for certain audio equipment applications. The embodiment shown in FIG. 2 is also able to suppress noise from oversampling filter 232. In particular, in an embodiment where the filter stage 220 is an integrator, the oversampling filter 232 is a first order sigma-delta modulator and the digital filter 240 is a first order filter, open loop noise introduced by the sigma-delta modulator 232 may be shaped to a first order (i.e., the noise goes down by 20 db per decade). However, the closed loop response of such an embodiment may suppress this noise by two more orders (i.e., one order from the filter stage 220 element and one order from the digital filter 240 element). In this way, such an embodiment may suppress noise from the oversampling filter 232 to the third order or higher (i.e., the noise falls by 60 db or more per decade).

FIG. 3 shows a block diagram of a digital power amplification system 300 according to an embodiment of the invention. The embodiment shown in FIG. 3 includes a signal processor 200 (as shown, for example, in FIG. 2), a binary power amplifier 320 and a demodulation filter 330. In this embodiment, a digital input signal 205 is sent through the signal processor 200 to obtain a pulse width modulated signal 235. The pulse width modulated signal 235, which in the depicted embodiment is in the form of a rectangular wave, may then be sent to a binary power amplifier 320 where the digital signal 235 is amplified to produce an amplified rectangular wave output 325. In one embodiment, the binary power amplifier 320 may be a Class-D type switching power amplifier that includes, for example, MOS-FETs. However, a binary power amplifier 320 of other embodiments of the present invention may include any of a variety of switch configurations and power levels.

In the embodiment depicted in FIG. 3, the amplified rectangular wave output 325 is filtered by a demodulation filter 330 to create an amplified analog output signal 335, which may be suitable for transmission to one or more speakers. In one embodiment, the demodulation filter 330 may be a simple RC filter.

Figure 4A:
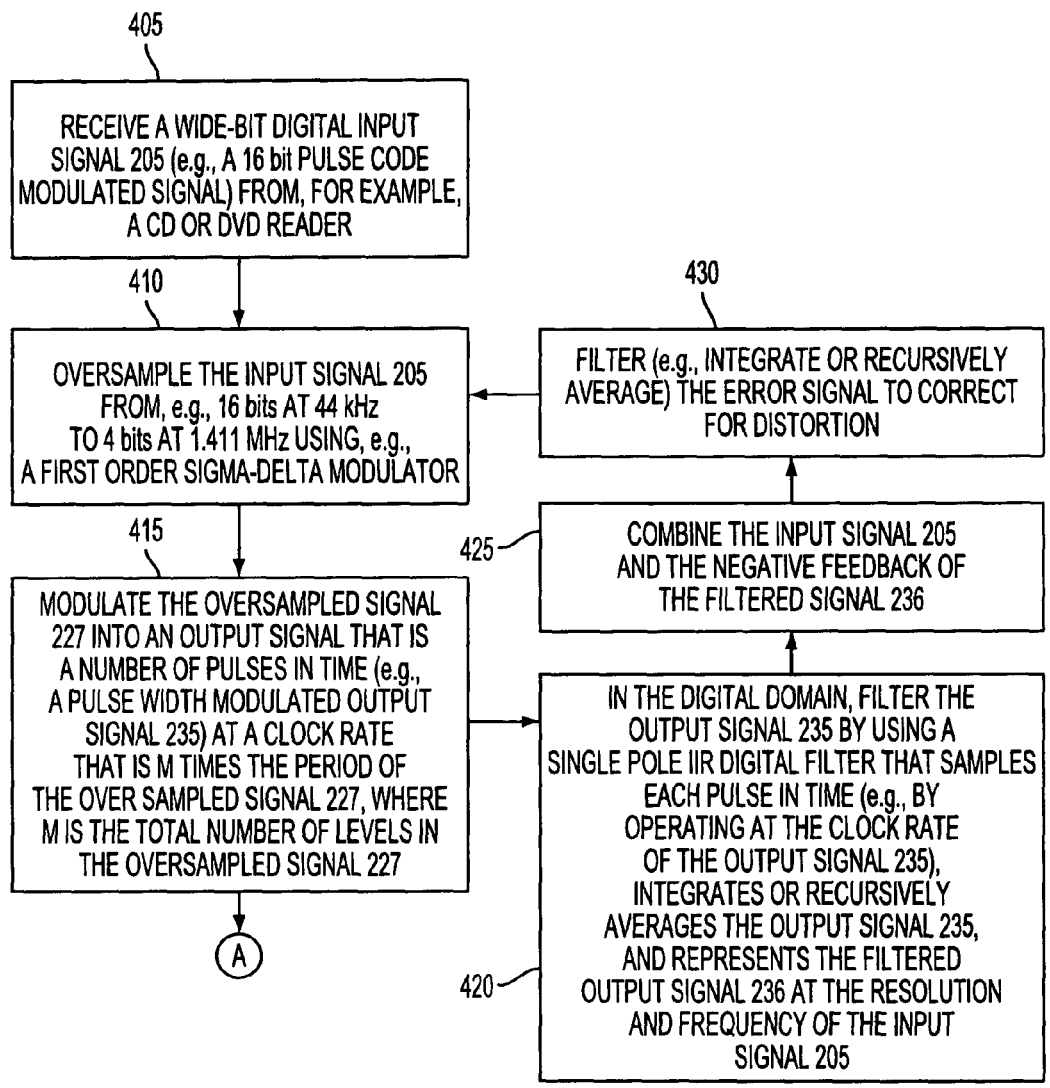
FIGS. 4a and 4b depict a block diagram of a method of modulating and amplifying a digital signal according to an embodiment of the present invention.
Figure 4B:
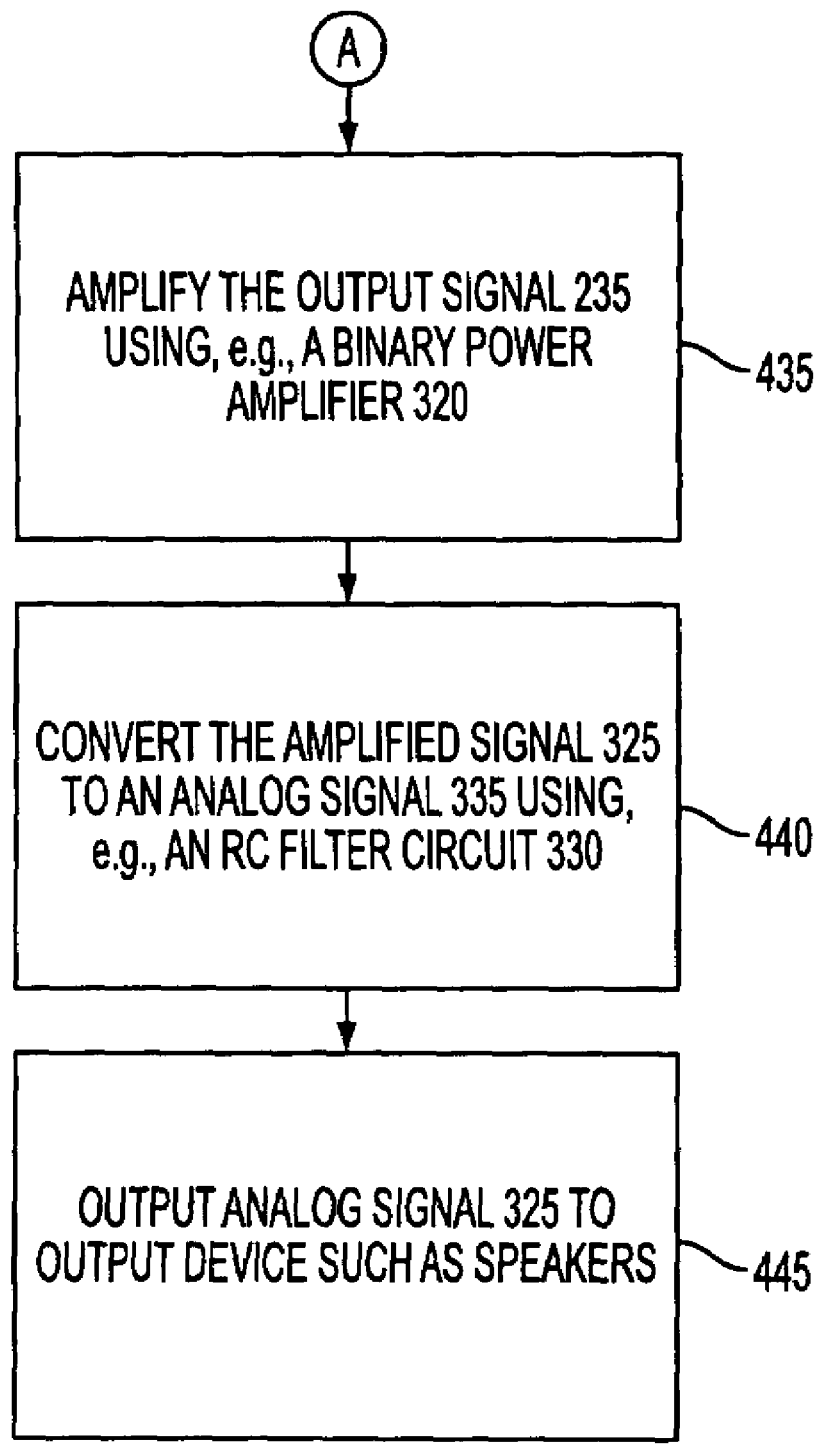

FIGS. 4a and 4b show block diagrams of a method of modulating and amplifying a digital signal according to an embodiment of the present invention. In such an embodiment, a digital input signal 205 is received from, for example, a CD or DVD reader (step 405). The input signal 205 is then oversampled using, for example, a first order sigma-delta modulator (step 410). In such an embodiment, this oversampling converts a wide-bit signal (e.g., 16 bits) into a narrow-bit signal (e.g., 4 bits) that is provided at a faster sampling rate.

Step 415 of FIG. 4a shows a second modulation stage. In the embodiment depicted in FIGS. 4a and 4b, the second modulation stage translates a small range of amplitude values (e.g., an oversampled pulse code modulated signal 227) into a small range of time values (e.g., a pulse width modulated signal) that are provided at a particular clock rate. Then, the pulses in time are measured in the digital domain at a clock rate equal to the clock rate at which the pulses in time have been provided. Step 420 of FIG. 4a depicts this step, and in particular, shows a technique of filtering the pulse width modulated digital signal 235 by integrating or recursively averaging the signal, and converting it into, for example, a 16-bit pulse code modulated signal at 44.1 kHz. In one embodiment, the pulse width modulated digital signal 235 is sampled by a digital filter 240 at the same clock rate as the clock rate that the pulse width modulated digital signal 235 is made.

As shown in FIG. 4a, the digital input signal 205 may be combined with a digital feedback signal which is, for example, a negative filtered signal 236 (step 425). Step 430 depicts a filtering technique (e.g., an integration or recursive averaging process) for gradually correcting any error between the filtered signal 236 and the digital input signal 205.

Next, the corrected digital output signal 235 may be amplified, as shown in step 435 of the embodiment shown in FIG. 4b. Step 440 of one embodiment is a low pass filter process which converts the amplified digital pulse width modulated output signal 235 into an analog signal. This filter process achieves a digital-to-analog conversion by essentially integrating the area beneath the square wave to produce an analog output.

Figure 5B:
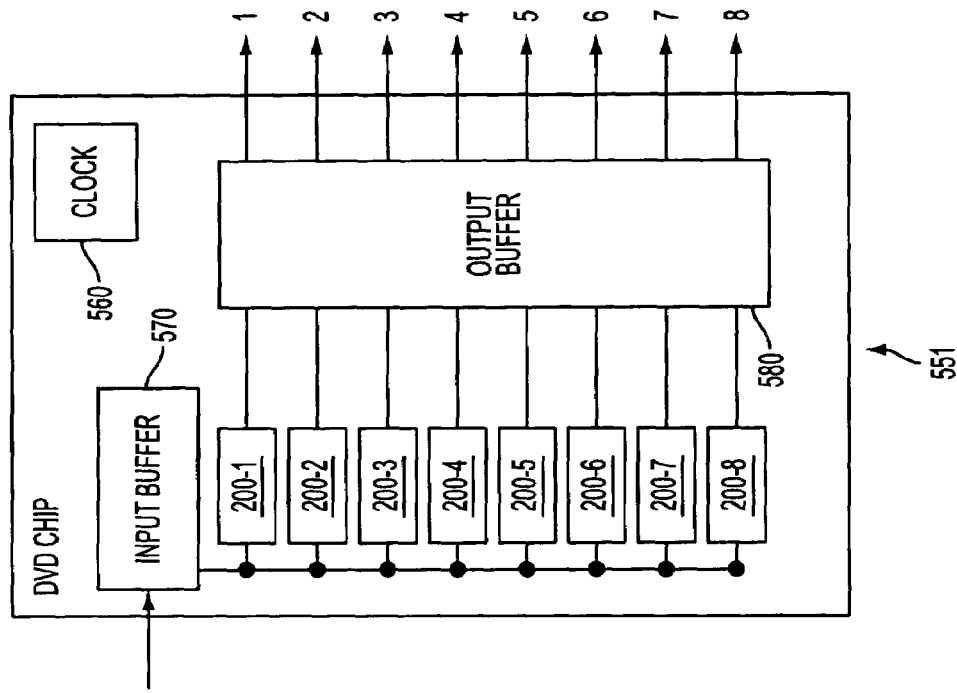
FIGS. 5a and 5b depict simplified integrated circuit chips 501, 510 according to embodiments of the present invention.
Figure 5A:
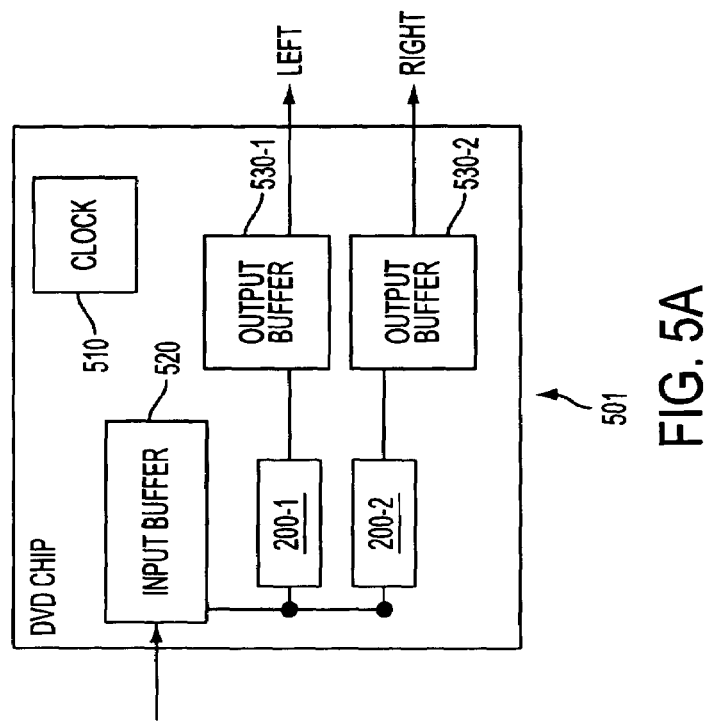

FIG. 5a shows a simplified integrated circuit chip 501 of an embodiment of the present invention. In the embodiment shown in FIG. 5a, the integrated circuit chip 501 includes two signal processors 200-1, 200-2, one for each of two output channels. Such a chip 501 may also include a master clock 510, one or more input buffers 520, and one or more output buffers 530-1, 530-2.

The embodiment shown in FIG. 5b is an integrated circuit chip 551 that includes eight signal processors 200-1 to 200-8, which may be used in a surround sound system to produce eight channels of output. This chip 551 may also have a master clock 560, one or more input buffers 570, and one or more output buffers 580.

The output frequency of certain audio equipment applications is expected to be in the range of 350 kHz to 800 kHz. If a sampling frequency of a DVD player is about 48 kHz, the sampling frequency of integrated circuit chips 501, 551 of certain embodiments of the present invention may be 12.288 MHz (i.e., 48 kHz*256). Master clocks 510, 560 for certain embodiments of integrated circuit chips 501, 551 may then operate at 12.288 MHz to produce outputs with frequencies of about 768 kHz. In such embodiments, both the pulse width modulators 234 and the digital filters 240 of the signal processors 200-1 to 200-N may operate at 12.288 MHz.

Figure 6:
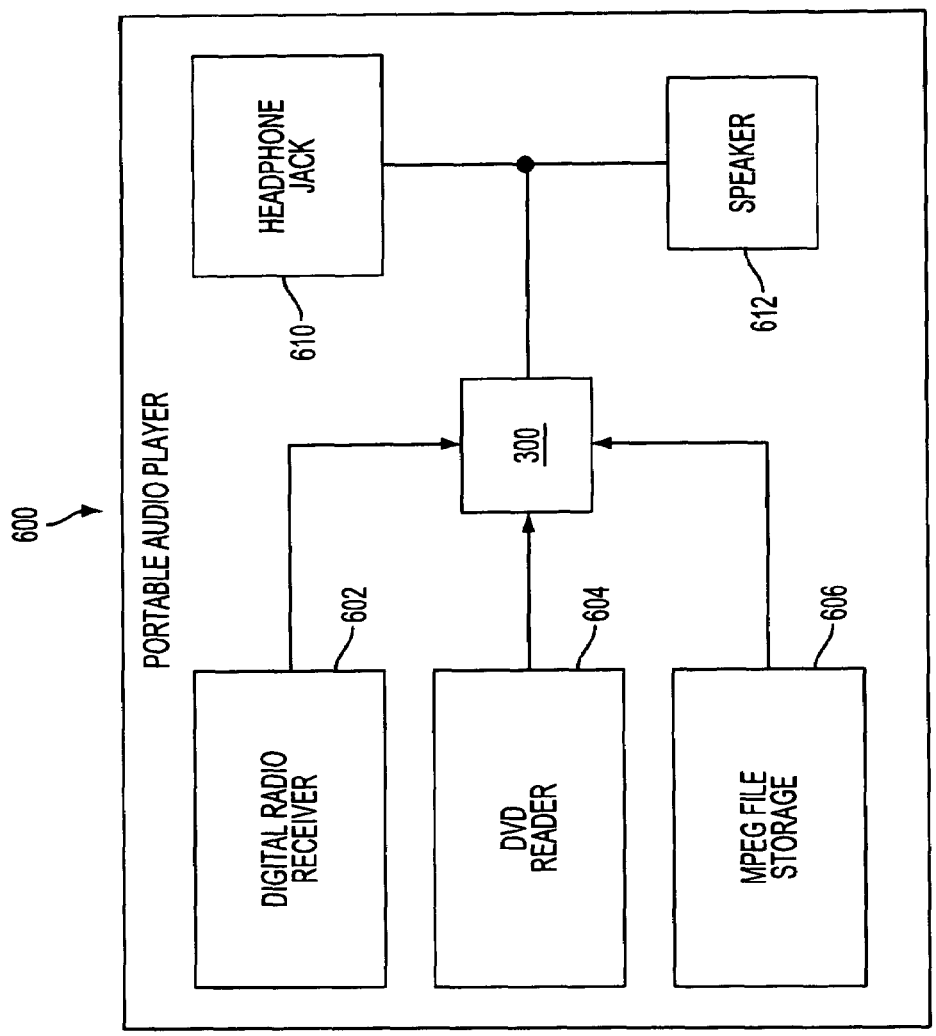
FIG. 6 depicts a portable audio player 600 according to one embodiment of the present invention.

FIG. 6 shows a portable audio player 600 according to one embodiment of the present invention. This portable player 600 may include a digital power amplification system 300, one or more digital audio signal sources, and one or more output devices such as a headphone jack 610 or a speaker 612-1. In accordance with certain embodiments of the present invention, the digital audio signal source may include one or more of the following: a digital receiver 602 (e.g., a radio signal receiver), a memory medium reader such as an optical disk reader 604 (e.g., a CD reader), or a memory device for storage of a digital audio file 606 (e.g., an MPEG file).

FIGS. 7a–7d show a computer code listing for certain Verilog modules that implement one embodiment of the present invention. In these modules, "Clk" is a clock signal that may run at a multiple of an audio data rate, for example 24 MHz is approximately 512 * 44.1 kHz. "Clken" is a clock enable signal that may be tied high, thus enabling every clock. "Reset" is an asynchronous reset, and will typically return to a low level after system initialization. "Phase" is a 5-bit counter in this example, and is expected to advance on each edge of the clock. "Phase" is used in the PWM cell to generate the PWM output bit. "In" is the input data, typically audio data in a 16 bit-word. The variable "pwm" is the output bit in a pulse width modulated format generated by these modules.

Figure 8:
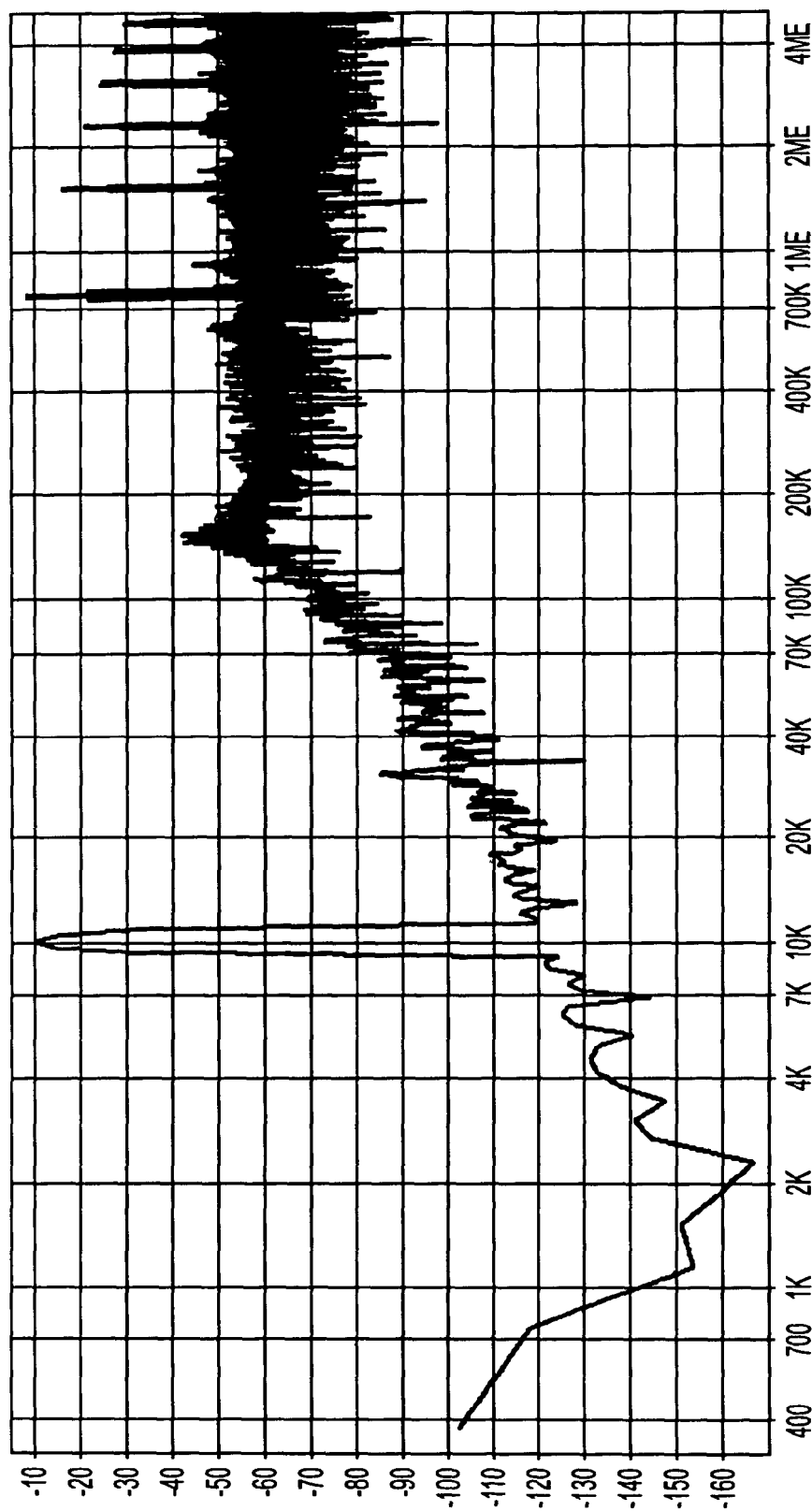
FIG. 8 depicts a frequency response plot for a computer model of one embodiment of the present invention.

FIG. 8 is a frequency response plot generated by a computer model of one embodiment of the present invention. In this modeled embodiment, the filter stage 220 is an integrator, the oversampling filter 232 is a first order sigma-delta modulator having 16 levels, and the pulse width modulator 234 is running at a clock rate that is 16 times the clock rate of the oversampling filter 232. The digital input signal 205 provided to the signal processor 200 of this modeled embodiment is 24 bits wide (as is the wide-bit filtered signal 236). The digital filter 240 of this modeled embodiment is a first order filter running at a clock rate of 27 MHz. As shown in FIG. 8, the modeled embodiment has favorable distortion and noise characteristics for certain applications or users, e.g., certain audio equipment applications.

Figure 9:
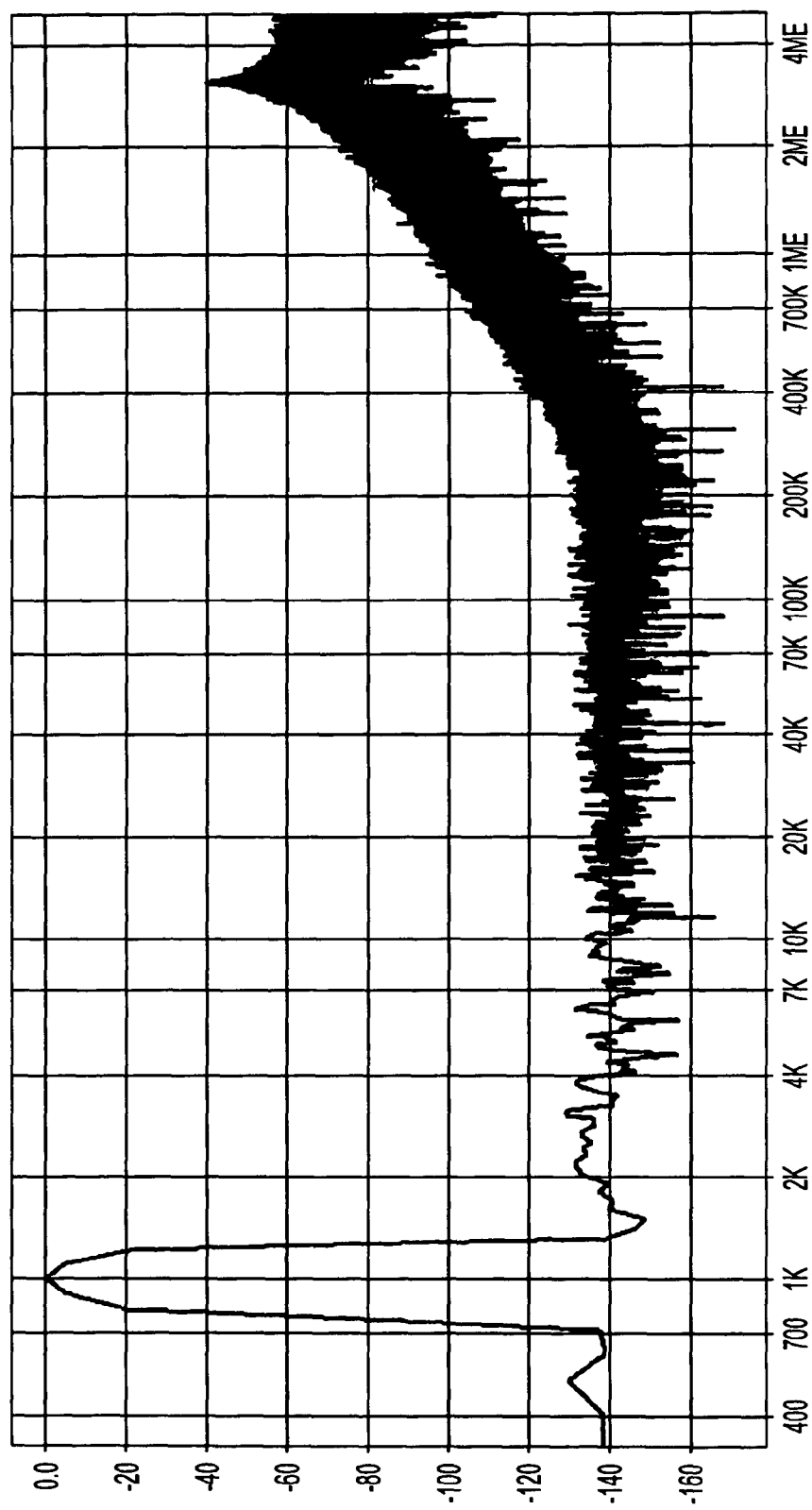
FIG. 9 depicts a frequency response plot for a computer model of another embodiment of the present invention.

FIG. 9 is a frequency response plot generated by a computer model of another embodiment of the present invention. In this second modeled embodiment, the filter stage 220 is a second order filter, the oversampling filter 232 is a first order sigma-delta modulator having 32 levels, and the pulse width modulator 234 is running at a clock rate that is 32 times the clock rate of the oversampling filter 232. The digital input signal 205 provided to the signal processor 200 of this modeled embodiment is 24 bits wide (as is the wide-bit filtered signal 236). The digital filter 240 of this second modeled embodiment is a first order filter running at a clock rate of 27 MHz. As shown in FIG. 9, the modeled embodiment generates essentially no distortion and very low noise up to about 200 kHz.

Figure 10:
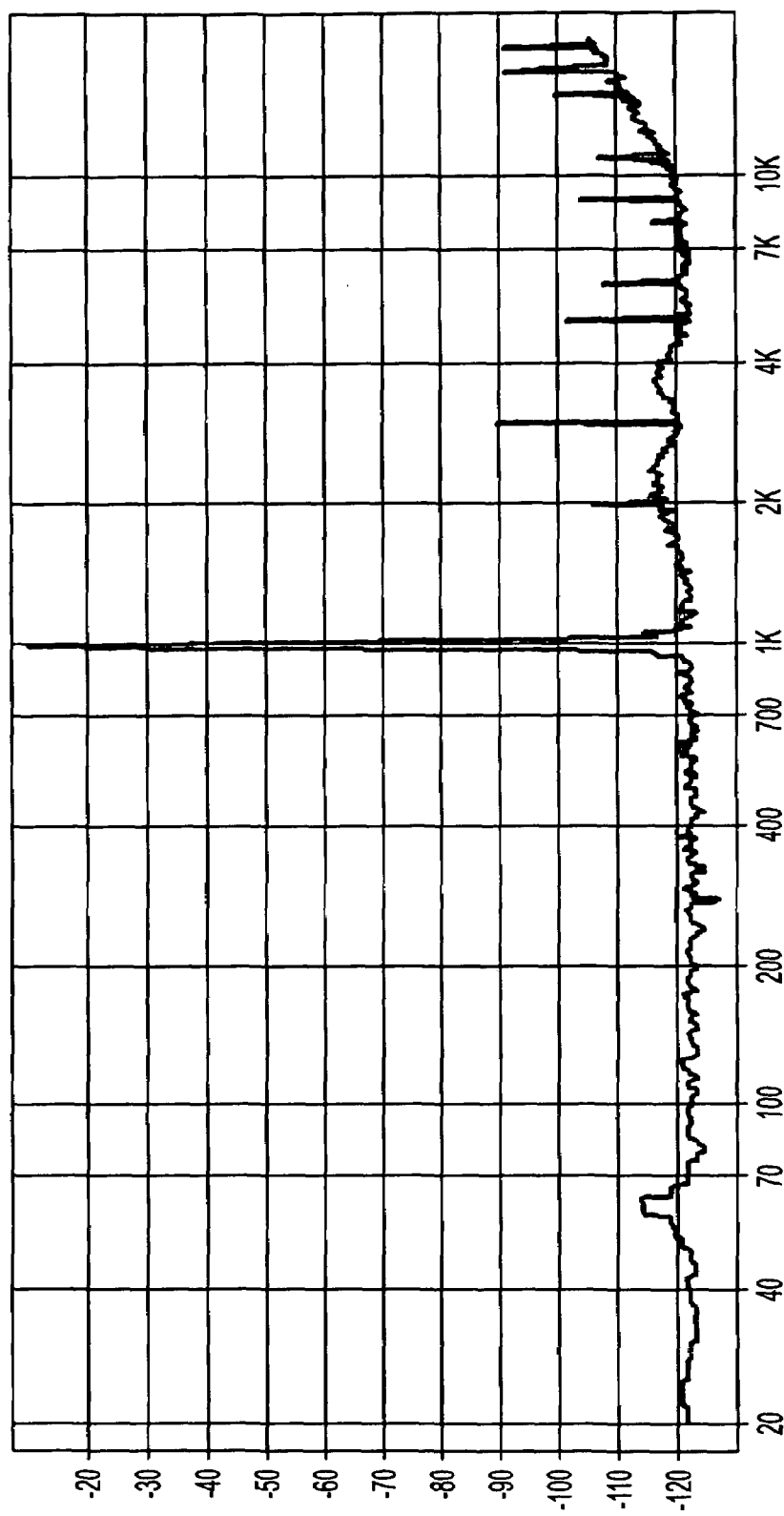
FIG. 10 depicts a frequency response plot measured using an FPGA implementation of the embodiment used to produce the plot shown in FIG. 9.

FIG. 10 is a frequency response plot generated by a signal processor 200 implemented on a field programmable gate array (FPGA) board that is measured using an audio measurement system. In this signal processor 200, the filter stage 220 is a second order filter, the oversampling filter 232 is a first order sigma-delta modulator having 32 levels, the and the pulse width modulator 234 is running at a clock rate that is 32 times the clock rate of the oversampling filter 232. The digital input signal 205 provided to the signal processor 200 is 24 bits wide (as is the wide-bit filtered signal 236). The digital filter 240 of this signal processor 200 is a first order filter running at a clock rate of 27 MHz. As shown in FIG. 10, the THD of such a signal processor 200 (of which the output has been filtered with an RC filter) is about 90 db.

Although illustrative embodiments and example methods have been shown and described herein in detail, it should be noted and will be appreciated by those skilled in the art that there may be numerous variations and embodiments which may be equivalent to those explicitly shown and described. For example, the scope of the present invention may not necessarily be limited in all cases to execution of the aforementioned steps in the order discussed. Unless otherwise specifically stated, the terms and expressions have been used herein as terms and expressions of description, not of limitation. Accordingly, the invention is not to be limited by the specific illustrated and described embodiments and examples (or terms or expressions used to describe them), but only by the scope of the amended claims.

What is claimed is:

1. A signal processor, comprising:
a pulse width modulator having a clock rate;
a digital filter configured to receive an output of said pulse width modulator, wherein said output comprises a distortion, and wherein said digital filter samples said output at said clock rate to suppress said distortion; and
an oversampling modulator upstream of and coupled to said pulse width modulator.

2. The signal processor of claim 1, wherein said oversampling modulator comprises a sigma-delta type modulator.

3. The signal processor of claim 2, wherein said oversampling modulator generates an oversampled signal having a period and a total number of levels, and wherein said clock rate is at least M times said period, where M is said total number of levels in said oversampled signal.

4. The signal processor of claim 3, wherein said sigma-delta type modulator comprises a first order sigma-delta type modulator.

5. The signal processor of claim 2, further comprising a filter upstream of said pulse width modulator.

6. The signal processor of claim 1, wherein said digital filter comprises an IIR filter.

7. The signal processor of claim 6, wherein said IIR filter comprises a single pole filter.

8. The signal processor of claim 1, wherein said digital filter comprises a low pass filter.

9. A signal processor, comprising:
a pulse width modulator having a clock rate;
a digital filter configured to receive an output of said pulse width modulator, wherein said output comprises a distortion, and wherein said digital filter samples said output at said clock rate to suppress said distortion; and
a feedback path comprising said digital filter.

10. An integrated circuit chip system comprising the signal processor of claim 1.

11. The integrated circuit chip system of claim 10, wherein said system provides a two-channel output.

12. The integrated circuit chip system of claim 10, wherein said system provides an eight-channel output.

13. A portable audio player comprising the signal processor of claim 1.

14. The portable audio player of claim 13, further comprising a digital audio signal source.

15. The portable audio player of claim 13, wherein said digital audio source comprises a memory medium reader.

16. The portable audio player of claim 15, wherein said memory medium reader comprises an optical disk reader.

17. The portable audio player of claim 14, wherein said digital audio signal source comprises a memory for storage of a digital audio file.

18. The portable audio player of claim 14, wherein said digital audio signal source comprises a digital receiver.

19. An audio power amplification system comprising the signal processor of claim 1.

20. The audio power amplification system of claim 19, further comprising an RC type demodulation filter.

21. A digital circuit for suppressing a distortion in a digital signal that exists after a pulse width modulation, wherein said pulse width modulation occurs at a clock rate, and wherein said digital circuit comprises a digital filter configured to receive said signal having said distortion and to sample said signal at said clock rate to suppress said distortion.

22. A digital signal processing circuit, comprising:
a pulse width modulator having an output with a distortion; and
means for sampling said output and suppressing said distortion in a digital domain; and
an oversampling modulator coupled to the input of the pulse width modulator.

23. The digital signal processing circuit of claim 22, wherein said oversampling modulator comprises a sigma-delta type modulator.

24. The digital signal processing circuit of claim 23, wherein said sigma-delta type modulator comprises a first order sigma-delta type modulator.

25. The digital signal processing circuit of claim 22, wherein said oversampling modulator is upstream of said pulse width modulator.

26. The digital signal processing circuit of claim 25, wherein said oversampling modulator generates an oversampled signal having a period and a total number of levels, and said pulse width modulator operates at a clock rate that is at least M times said period, where M is said total number of levels in said oversampled signal.

27. The digital signal processing circuit of claim 22, further comprising a filter upstream of said pulse width modulator.

28. An integrated circuit chip system comprising the signal processor of claim 22.

29. The integrated circuit chip system of claim 28, wherein said system provides a two-channel output.

30. The integrated circuit chip system of claim 28, wherein said system provides an eight-channel output.

31. An audio power amplification system comprising the signal processor of claim 22.

32. The audio power amplification system of claim 31, further comprising an RC type demodulation filter.

33. A portable audio player comprising the signal processor of claim 22.

34. The portable audio player of claim 33, further comprising a digital audio signal source.

35. The portable audio player of claim 34, wherein said digital audio signal source comprises a memory medium reader.

36. The portable audio player of claim 35, wherein said memory medium reader comprises an optical disk reader.

37. The portable audio player of claim 34, wherein said digital audio signal source comprises a memory for storage of a digital audio file.

38. The portable audio player of claim 34, wherein said digital audio signal source comprises a digital receiver.

39. The digital signal processing circuit of claim 22, wherein said sampling occurs at a clock rate of said pulse width modulator.

40. A signal processor for modulating a digital input signal, comprising a closed loop digital circuit comprising:
a forward path comprising a first filter stage coupled with and upstream from an encoder stage, wherein said encoder stage comprises a first order sigma-delta type modulator and a pulse width modulator, wherein said sigma-delta type modulator generates an oversampled signal having a period and a total number of levels, and said pulse width modulator operates at a clock rate that is at least M times said period, where M is said total number of levels in said oversampled signal, and wherein said forward path produces an output having a distortion; and
a feedback path comprising a digital filter that samples said output in a digital domain to suppress said distortion.

41. The signal processor of claim 40, wherein said digital filter samples said output at said clock rate.

42. The signal processor of claim 40, wherein said signal processor exhibits a modulation depth of up to about −1 db in an audio frequency band.

43. The signal processor of claim 40, wherein said signal processor reduces a total harmonic distortion to about 90–100 db.

44. A method, comprising:
modulating a first pulse code modulated signal having a first resolution using a sigma-delta type modulator into a second pulse code modulated signal having a second resolution, wherein said second resolution is smaller than said first resolution;
modulating said second pulse code modulated signal into a third signal comprising a plurality of pulses in time having a clock rate; and
filtering in a digital domain said plurality of pulses in time to suppress a distortion in said third signal.

45. The method of claim 44, wherein said first resolution is between 12 bits and 24 bits inclusively.

46. The method of claim 45, wherein said first resolution is 16 bits.

47. The method of claim 45, wherein said second resolution is between 2 bits and 6 bits inclusively.

48. The method of claim 47, wherein said second resolution is 4 bits.

49. The method of claim 44, wherein said sigma-delta type modulator is a first order sigma-delta type modulator.

50. The method of claim 44, wherein said modulating said second pulse code modulated signal comprises using a pulse width modulator.

51. The method of claim 44, wherein said filtering comprises using a digital filter.

52. The method of claim 51, wherein said digital filter comprises an IIR filter.

53. The method of claim 52, wherein said IIR filter comprises a single pole filter.

54. The method of claim 51, wherein said digital filter comprises a low pass filter.

55. The method of claim 44, wherein said filtering comprises forming a feedback signal having said first resolution.

56. The method of claim 44, wherein said plurality of pulses in time is a substantially small range of pulses in time.

57. The method of claim 44, wherein said modulating said first pulse code modulated signal comprises generating an oversampled signal having a period and a total number of levels, wherein said modulating said second pulse code modulated digital signal occurs at a clock rate that is at least M times said period, where M is said total number of levels in said oversampled signal.

58. The method of claim 44, wherein said filtering comprises sampling at said clock rate.

59. The method of claim 44, further comprising amplifying said third signal to produce an amplified output.

60. The method of claim 59, further comprising creating an analog signal from said amplified output.

61. The method of claim 60, wherein said creating comprises using an RC filter circuit.

62. A device, comprising:
means for modulating a first pulse code modulated signal having a first resolution using a sigma-delta type modulator into a second pulse code modulated signal having a second resolution, wherein said second resolution is smaller than said first resolution;
means for modulating said second pulse code modulated signal into a third signal comprising a plurality of pulses in time having a clock rate; and
means for filtering in a digital domain said plurality of pulses in time to suppress a distortion in said third signal.

63. The signal processor of claim 5, wherein the filter is an integrator.

64. The digital signal processing circuit of claim 27, wherein the filter is an integrator.

65. The signal processor of claim 40, wherein said signal processor exhibits a modulation depth of up to about 0 db in an audio frequency band.

66. The signal processor of claim 40, wherein said signal processor reduces a total harmonic distortion to about 90–140 db.

67. The method of claim 44, wherein said first resolution is between 12 bits and 24 bits inclusively.

68. A loop that corrects distortion caused by transforming an oversampled pulse code modulated signal to a pulse width modulated signal, including;
- a wide-bit input signal;
- a difference element accepting the wide-bit input signal;
- an input filter coupled to the difference element;
- an oversampler coupled to the input filter, producing an oversampled signal having less precision and higher frequency than the wide-bit signal;
- a pulse width modulator coupled to the oversampler;
- an output coupled to the pulse width modulator; and
- a digital feedback filter coupled to the pulse width modulator, the digital feedback filter
  - producing a correction signal that at least partially compensates for undesired distortion introduced by the pulse width modulator,
  - formatting the correction signal to match precision and frequency of the wide-bit input signal and
  - feeding back the formatted correction signal to the difference element.

69. The loop of claim 68, wherein the summing element calculates a difference between the wide-bit input signal and the formatted correction signal.

70. The loop of claim 68, wherein input filter is an integrator.

71. The loop of claim 68, wherein input filter is a second order element of the oversampler.

72. The loop of claim 68, wherein the digital feedback filter is a single pole IIR filter.

73. The loop of claim 68, wherein the digital feedback filter is an integrator.

74. The loop of claim 68, wherein the digital feedback filter is a recursive averager.

75. The loop of claim 68, wherein the oversampler is a sigma delta modulator.

76. A method of preprocessing a pulse encoded digital signal for amplification by a digital amplifier, the method including:
- oversampling a wide-bit input signal to produce a second signal that has lower bits precision than the input signal;
- converting the second signal into a pulse width modulated signal, whereby undesirable distortion is introduced;
- digitally filtering the pulse width modulated signal to correct at least part of the undesirable distortion and produce a correction signal; and
- producing a corrected pulse width modulated signal using the correction signal combined with a version of the input signal.

77. The method of claim 76, further including:
- formatting the correction signal to match bit-width and frequency of the input signal;
- feeding back the formatted correction signal and filtering it together with the input signal.

78. The method of claim 77, wherein an integrator is used to filter the formatted correction signal together with the input signal.

79. The method of claim 76, wherein the input signal has about 12 to 24 bits precision per sample.

* * * * *